US010839356B2

(12) United States Patent
Celik et al.

(10) Patent No.: US 10,839,356 B2
(45) Date of Patent: Nov. 17, 2020

(54) METHOD, ARRANGEMENT AND COMPUTER PROGRAM PRODUCT FOR A CONDITION-BASED CALCULATION OF A MAINTENANCE DATE OF A TECHNICAL INSTALLATION

(71) Applicant: SIEMENS AKTIENGESELLSCHAFT, Munich (DE)

(72) Inventors: Serdar Celik, Nuremberg (DE); Norbert Kaiser, Eckental (DE)

(73) Assignee: Siemens Aktiengesllschaft, Munich (DE)

( * ) Notice: Subject to any disclaimer, the term of this patent is extended or adjusted under 35 U.S.C. 154(b) by 610 days.

(21) Appl. No.: 15/328,990

(22) PCT Filed: Jul. 25, 2014

(86) PCT No.: PCT/EP2014/066073
§ 371 (c)(1),
(2) Date: Jan. 25, 2017

(87) PCT Pub. No.: WO2016/012056
PCT Pub. Date: Jan. 28, 2016

(65) Prior Publication Data
US 2017/0213195 A1 Jul. 27, 2017

(51) Int. Cl.
*G06Q 10/00* (2012.01)
*G05B 23/02* (2006.01)
(Continued)

(52) U.S. Cl.
CPC .......... *G06Q 10/20* (2013.01); *G01R 31/327* (2013.01); *G05B 23/0283* (2013.01); *G06Q 10/1095* (2013.01); *G05B 2219/32234* (2013.01)

(58) Field of Classification Search
CPC .... G06Q 10/20; G06Q 10/1095; G06Q 10/04; G06Q 10/06315; G06Q 10/06;
(Continued)

(56) References Cited

U.S. PATENT DOCUMENTS 9,477,222 B2   10/2016  Schramm et al.
2005/0149570 A1  7/2005  Sasaki et al.
(Continued)

FOREIGN PATENT DOCUMENTS

CA    2782276 A1 *  1/2013  ......... G05B 23/0275
CN    102067049 A   5/2011
(Continued)

*Primary Examiner* — Regis J Betsch
*Assistant Examiner* — Kaleria Knox
(74) *Attorney, Agent, or Firm* — Laurence Greenberg; Werner Stemer; Ralph Locher

(57) ABSTRACT

The condition of a technical installation is automatically monitored. A measured value of at least one component of the installation is sensed by at least one sensor device on the installation, and the at least one measured value is used, in a data processing arrangement specific to the installation, for determining a current operating state of the installation. By way of the data processing arrangement, including component-specific aging functions, a future chronological course of the operating condition is determined from the current operating condition, and a maintenance interval for the installation is adjusted on the basis of the future chronological course of the operating condition, in order to determine a next maintenance date of the installation. A corresponding arrangement and a computer program product for condition monitoring are also described.

16 Claims, 1 Drawing Sheet

(51) Int. Cl.
*G01R 31/327* (2006.01)
*G06Q 10/10* (2012.01)

(58) Field of Classification Search
CPC .............. G01R 31/327; G05B 23/0283; G05B 2219/32234; G05B 23/0248; G05B 23/0275; G05B 23/02; F03D 80/50; G06F 11/0793
See application file for complete search history.

(56) References Cited

U.S. PATENT DOCUMENTS

| | | | |
|---|---|---|---|
| 2007/0088570 A1 | 4/2007 | Shetty et al. | |
| 2009/0132321 A1* | 5/2009 | Kamisuwa | G06Q 10/06 705/7.22 |
| 2009/0312999 A1 | 12/2009 | Kasztenny et al. | |
| 2010/0313072 A1* | 12/2010 | Suffern | G06F 11/0793 714/37 |
| 2011/0172973 A1* | 7/2011 | Richards | G05B 23/0248 703/2 |
| 2012/0065918 A1* | 3/2012 | Larrasoana Alconero | F03D 80/50 702/113 |
| 2013/0024179 A1* | 1/2013 | Mazzaro | G06Q 10/04 703/18 |
| 2013/0179028 A1 | 7/2013 | Gu et al. | |
| 2014/0278711 A1* | 9/2014 | Fuller | G06Q 10/06315 705/7.25 |
| 2015/0206104 A1 | 7/2015 | Suzuki et al. | |

FOREIGN PATENT DOCUMENTS

| | | | | |
|---|---|---|---|---|
| DE | 102007029248 A1 | 1/2009 | | |
| DE | 102010049909 A1 | 5/2012 | | |
| EP | 2549415 A1 | 1/2013 | | |
| JP | 2005182465 A | 7/2005 | | |
| JP | 2012-008782 | * | 1/2012 | .............. G05B 23/02 |
| JP | 2012008782 A | 1/2012 | | |
| JP | 2013018482 A | 1/2013 | | |
| JP | 2014021627 A | 2/2014 | | |

\* cited by examiner

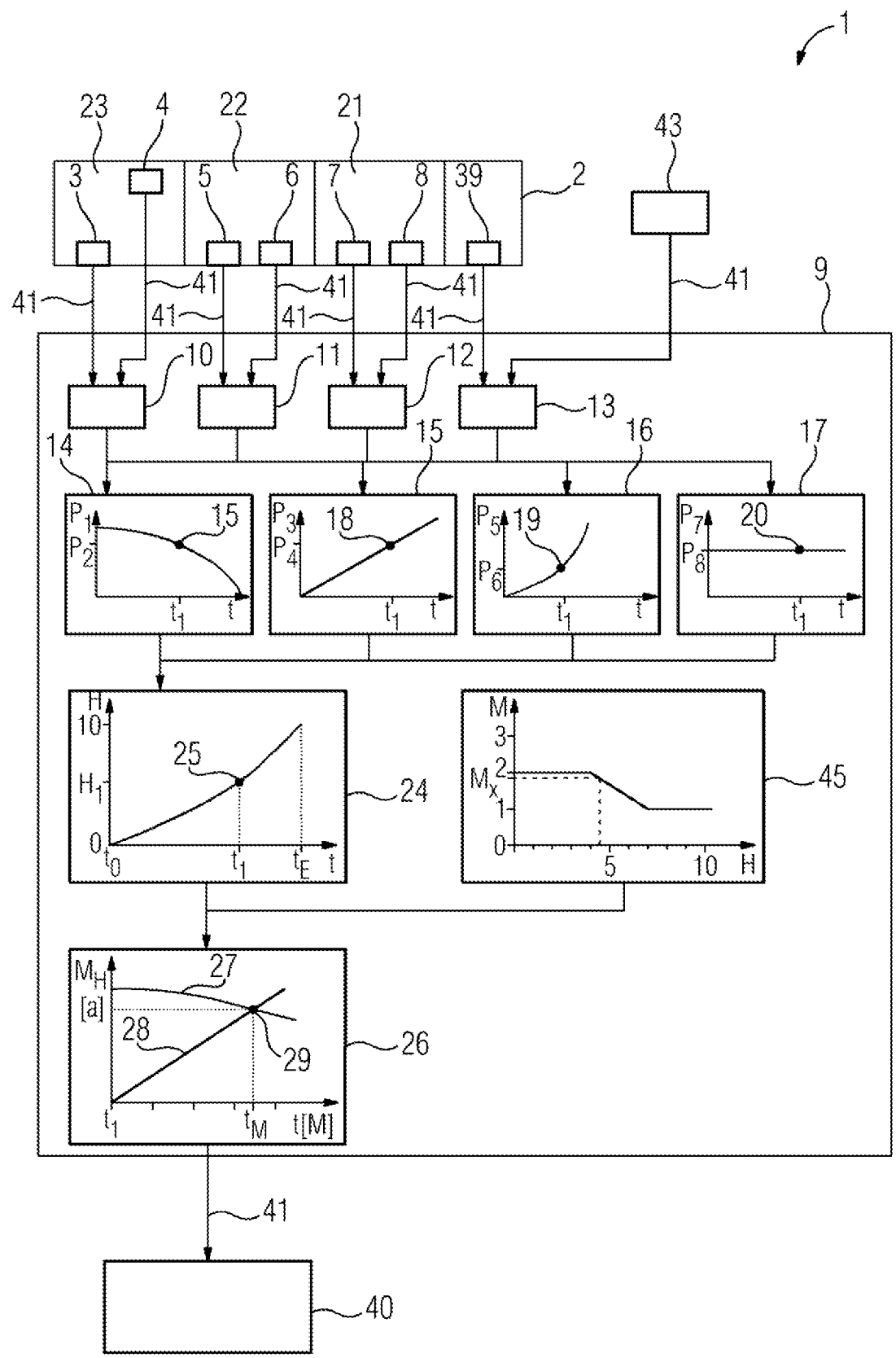

METHOD, ARRANGEMENT AND COMPUTER PROGRAM PRODUCT FOR A CONDITION-BASED CALCULATION OF A MAINTENANCE DATE OF A TECHNICAL INSTALLATION

BACKGROUND OF THE INVENTION

Field of the Invention

The invention relates to a method for monitoring the condition of a technical installation.

When monitoring the condition of technical installations, data from different sources is frequently used in order to make sound decisions about the condition of an installation and, if necessary, to carry out necessary maintenance or installation replacements. The data used here is often not up-to-date, but comprises static measurements recorded once.

Technical installations refer here, for example, to electrical installations such as transformers or gas-insulated switchgear. A technical installation can, however, also be non-electrical installations such as, for example, mechanical installations. Examples for a mechanical installation are cement mills, lift bridges or piping networks with inbuilt operating equipment such as slide valves, pumps or flow meters. Another kind of installation that can be monitored in the sense of the invention are buildings such as houses or stadiums.

At present, online condition monitoring is performed as a rule on technical installations in order to quickly detect malfunctions that have arisen and to raise appropriate repair or maintenance orders. The decision as to when a maintenance or replacement of a functioning installation is necessary is made on the basis of the experience of a maintenance technician, empirical figures for the service life of the type of installation concerned, and cost considerations.

The following is known from the conference publication "Dynamic Fleet Wide Condition Assessment Tool of Power Transformers" by L. Cheim, P. Lorin and P. Khanna, "Trafotech 2014—Session V: Towards Maintenance Free Transformers". A method for automatic condition monitoring of a technical installation in which, by means of at least one sensor device at the installation, at least one measured value of at least one component of the installation is recorded and the at least one measured value is used in a data-processing arrangement, in each case specifically for the installation, for the determination of a current operating condition of the installation.

SUMMARY OF THE INVENTION

The invention addresses the object of providing a generic method with which technical installations can be particularly efficiently operated.

The invention achieves this object through a method as claimed.

Operating condition is intended here according to the invention to refer to a value that indicates the technical condition of a technical installation that is in operation and which makes different technical installations comparable. An example of such a value is the "health index" frequently encountered in so-called "condition monitoring" systems, which can for example adopt values between 0 and 10, where the value 10 stands for an old installation with a high degree of wear.

An important advantage of the method according to the invention consists in that by means of the current operating condition of the technical installation, which is determined by means of at least one measured value, taking aping effects in the installation into account, a future chronological course of the operating condition is determined automatically; by means of this expected chronological course it is possible, for example, to determine the operating condition of the technical installation that will be found at any chosen later point in time. The next maintenance date can then be specified on the basis of the relationships, which are usually already known, between the operating condition and the maintenance interval for the installation concerned.

Because the specification of the next maintenance date is based on the at least one measured value of the technical installation, which is usually acquired online, functioning installations can thus be used for an optimum length of time before a maintenance has to be initiated. Costs for the maintenance are saved in this way. It is a particular advantage of the method according to the invention that an online condition monitoring system can be linked with a maintenance management system that previously has been operated offline.

The inclusion of component-specific aping functions in the determination of the future chronological course of the operating condition makes it advantageously possible to predict a future deterioration in the operating condition, since the aping functions affect the chronological course of the operating conditions expected in future, or are taken into account in the determination of the future chronological course of the operating condition.

This is furthermore advantageous since, through the aping functions, empirical values for the aping of a component can be automatically included. An installation can thus always be maintained as late as possible before there is a threat of a fault or failure.

Adjusting the maintenance interval for the installation makes it possible, when for example the manufacturer has indicated a maintenance interval of 5 years, to shorten the interval to 3 years if the operating condition of the installation is comparatively poor, and correspondingly to specify an earlier maintenance date, which saves costs since the installation can be maintained before a fault occurs.

In a preferred form of embodiment of the method according to the invention, a transformer, a gas-insulated switchgear or an air-insulated switchgear is used as the installation. This is advantageous, because these kinds of installations are known from experience to be subject to aping processes, and have to be regularly maintained and/or replaced.

In a further preferred form of embodiment of the method according to the invention, the specification of the next maintenance date is continuously updated on the basis of the at least one recorded measured value. This is an advantage, because through such an online monitoring of the technical installation, all the available data is continuously kept up-to-date and used for the specification of the maintenance date.

In a further preferred form of embodiment of the method according to the invention, the maintenance interval is adjusted, in that a prespecified maintenance interval respectively for a subsequent point in time with a specified time interval from the current date is adjusted taking into account the operating condition at the subsequent point in time known from the future chronological course of the operating condition, wherein the maintenance interval determined until the subsequent point in time is a predetermined maintenance interval for the next subsequent point in time, until the maintenance interval has become so short that it coincides with a subsequent point in time. This is an advantage because a maintenance date can be calculated particularly easily and with low computing effort through this iterative approach. Here, for example, for each month following the current date, the operating condition to be expected then, which deteriorates from month to month due to the aping of the installation, is used, and employed for a corresponding shortening of the maintenance interval. It is, however, also possible that the maintenance interval is extended in comparison with the manufacturer's data, since the installation has only been worn a little, and a good operating condition is present.

In a further preferred form of embodiment of the method according to the invention, the operating condition of the technical installation is determined from a plurality of partial operating conditions, wherein individual components of the installation are each allocated to the individual partial operating conditions, and wherein the individual partial operating conditions are each used in a weighted manner. This is an advantage, because in this way the operating condition can be calculated particularly precisely. In particular, the weighting makes it possible to take components that are particularly subject to faults strongly into account, so that the maintenance date can always occur before the installation fails.

In the case, for example, of a gas-insulated switchgear in the high-voltage field, the partial operating conditions of the insulation system, drive mechanism, disconnection capability and other factors are used.

In a further preferred form of embodiment of the method according to the invention, the weighting of an individual partial operating condition is determined on the basis of a known total fault rate for the type of the installation, in that the relative proportion that the allocated components have in the total fault rate is determined for these components. This is advantageous because it is possible in this way to use the very diverse measured data that is supplied by sensors at an installation with different weighting for calculating the operating condition, wherein whichever operating condition dimension is the most liable to faults is included most strongly in the total operating condition.

In the high-voltage field, the following weighting is made for example for a gas-insulated switchgear with a rated voltage of 132 kV: insulation system (IS) 50.7%, drive mechanism (DM) 23.4%, breaking capacity (BC) 12.3% and other factors (OF) 13.6%.

In another example, in a gas-insulated switchgear with a rated voltage of 400 kV, the partial operating conditions are weighted differently: insulation system 51.9%, drive mechanism 21.1%, breaking capacity 7.7% and other factors 18.3%.

The percentage figures quoted for the two different kinds of gas-insulated switchgear result here from empirical values obtained from many years of operation of such switchgear. It has, for example, been found that the components of the insulation system contribute to 50.7% of all faults in the 132 kV installation. For this reason, a corresponding weighting of these components is undertaken for the health index. These, and other empirical values, can be found, for instance, in the study "Report on the second international survey on high voltage gas insulated substations (GIS) service experience" by Cheung et al., which was published in CIGRE TB 150, Issue 1, page 17 in the year 2000. The use of other sources of empirical values is, however, also possible, from which it is however possible that a weighting that differs from those in these two examples may emerge.

In a further preferred form of embodiment of the method according to the invention, each recorded measured value of a component is allocated to an individual partial operating condition, wherein each measured value is included in the determination of the allocated individual partial operating condition with a relative proportion in the allocated partial operating condition, in that for the allocated component the relative proportion that this component has in the fault rate of all the components of this individual partial operating condition is determined. This is an advantage, because in this way components that are particularly liable to fail can be taken into account particularly strongly in the calculation of the operating condition.

An example for the weighting of components based on the known fault frequencies is listed in the following table, for each of a gas-insulated switchgear rated at 132 kV, and one rated at 400 kV:

| Partial operating condition | Component | GIS type 132 kV [%] | GIS 400 kV [%] |
| --- | --- | --- | --- |
| Insulation system | | 50.7 | 51.9 |
| | High-voltage components | 16.3 | 18.3 |
| | Metallically grounded components | 0.6 | 0.9 |
| | Gas insulation | 6.5 | 12.5 |
| | Solid insulation inside the GIS installation | 10.4 | 15.4 |
| | SF6 gas insulation | 14.3 | 3.8 |
| | SF6 gas pressure monitoring | 2.6 | 1.0 |
| Drive mechanism | | 23.4 | 22.1 |
| | Operating mechanism-compressor, motors, pumps, pipe joints | 7.2 | 6.7 |
| | Operating mechanism-energy store, mechanical conversion, actuator and damper | 16.2 | 15.4 |
| Breaking capacity | | 12.3 | 7.7 |
| | Breaker apparatus (e.g. chamber, switch or breaker arrangement) | 9.1 | 4.8 |
| | Other main components (e.g. contact bolts) | 3.2 | 2.9 |
| Other factors | | 13.6 | 18.3 |

The other factors include, for example, the age of the component, maintenance compliance, inspection compliance, inspection results and maintenance results. In addition, parts of the installation which have not yet been given an explicit allocation for their inclusion in the operating condition—as described above—are included under other factors.

According to another example, for an air-insulated switchgear operating at medium voltage with rated voltages of 11 kV or 33 kV, the following weighting of components and partial operating conditions results taking the known fault rates as a basis:

| Partial operating condition | Component | MV AIS 11 kV/ 33 kV [%] |
|---|---|---|
| Insulation system | | 9.9 |
| | Insulation fault | 1.9 |
| | Deterioration of electrical performance | 4.0 |
| | Deterioration of mechanical insulation performance | 3.1 |
| | Electrical over-voltage | 0.9 |
| Drive mechanism | | 62.2 |
| | Dirt and contamination | 4.7 |
| | Contact positioning/adjustment | 1.4 |
| | Corrosion | 0.1 |
| | Drive leaks | 46.7 |
| | Rubber lining | 7.3 |
| | General mechanical wear of the drive | 2.1 |
| Breaking capacity | | 19.6 |
| | Contact material consumption | 14.1 |
| | Material fatigue at the main contacts | 1.0 |
| | Material fatigue of other driver components | 4.5 |
| Other factors | | 8.3 |

The same other factors as for gas-insulated switchgear can be employed here for the air-insulated switchgear in this example.

In a further preferred form of embodiment of the method according to the invention, it is established which partial operating conditions correlate, and a quotient is formed for each two correlating partial operating conditions, wherein, when the quotient falls below a lower threshold value or exceeds an upper threshold value, a warning message is issued, so that a maintenance date can be brought forward.

This is an advantage, because it is usually assumed that the components of an installation age with comparable speed; if the operating condition of a single operating condition dimension deteriorates in comparison with another operating condition dimension particularly strongly, this an indication of a possibly forthcoming fault in a component of the installation. In this case, a maintenance date must be brought forward in order to prevent a failure of the installation.

How much the four individual partial operating conditions influence each other is shown in the following table by way of example for gas-insulated switchgear. "Level" here refers to the strength of the influence, and R is an influence parameter based on empirical data as can, for example, be obtained from the study referred to above. There is thus, for example, a high level of influence between the drive mechanism and the breaking capacity, meaning that faults in the drive lead to faults in the switching capacity of an installation.

The mutual influence is indicated by the influence parameter R, where R<0.15 is considered to be a low dependency, R between 0.15 and 0.35 as a medium influence, and R between 0.35 and 0.5 as a strong influence.

Influence parameters R for gas-insulated switchgear are each listed in the following table:

| Influence | Level | R |
|---|---|---|
| IS-BC | low | 0.08 |
| DM-BC | high | 0.42 |
| BC-IS | medium | 0.24 |
| BC-DM | low | 0.04 |
| OF-IS | medium | 0.34 |
| OF-DM | medium | 0.26 |
| OF-BC | low | 0.06 |

A lower threshold value can, for example, be 0.8, and an upper threshold value can be 1.25, since these two threshold values have in practice been found to be valuable.

In a further preferred form of embodiment of the method according to the invention, the component-specific aping functions comprise an aping function that is constant over time.

In a further preferred form of embodiment of the method according to the invention, the component-specific aping functions comprise a linearly increasing aping function that increases linearly over time.

In a further preferred form of embodiment of the method according to the invention, the component-specific aping functions comprise an aping function that increases exponentially over time.

In a further preferred form of embodiment of the method according to the invention, the component-specific aping functions comprise an aping function that falls exponentially over time.

In a further preferred form of embodiment of the method according to the invention, a chronological course of a failure probability of the installation is determined on the basis of the chronological course of the operating condition, wherein a known chronological course of the failure probability of the type of the installation is taken into account. This is an advantage, because the failure probability of the technical installation supplies valuable information for the decision regarding the next maintenance date or, in relevant cases, necessary replacement of the installation.

In a further preferred form of embodiment of the method according to the invention, a chronological course of a risk of failure is determined from the chronological course of the failure probability of the installation, taking into account the consequences of a failure of the installation. This is advantageous, because in this way installations of particular significance, for example for the network stability or for the supply of important infrastructure such as hospitals or the like, can be particularly taken into account in the calculation of the risk of failure due to the particularly serious consequences of failure. A higher failure risk is allocated to a transformer that serves a network section with a hospital than to a transformer without special significance under otherwise the same conditions.

In a further preferred form of embodiment of the method according to the invention, the failure risk comprises at least one of the following risks: the expected costs of failure, investment expenditure, operating costs, environmental risk, safety risk, network performance risk.

This is an advantage, because a distribution of the failure risk over various kinds of risk enables a particularly accurate estimate of the risk.

In a further preferred form of embodiment of the method according to the invention, the consequences of the failure of the installation include the costs of the failure that depend on the type of the installation and the location of the installation. This is an advantage, because through taking the costs for the maintenance into account, an important financial factor is included. Thus for example, a particularly expensive maintenance can be delayed if there are sufficient safety reserves, or can be coordinated with a somewhat later maintenance date of another technical installation in the same area, in order to save travel costs.

In general, using the method according to the invention, maintenance dates can be coordinated in the way referred to above, in order to be able to maintain a plurality of technical installations on one day and/or on one trip.

In a further preferred form of embodiment of the method and/or an availability of spare parts is also taken into account in the calculation of the failure risk.

In a further preferred form of embodiment of the method according to the invention, a point in time for the exchange or repair of the installation is determined, in that a chronological course of the discounted new price of the installation is calculated, and the minimum of the chronological course of the total of the failure risk and the discounted new price is determined. This is an advantage, because the user is thus constantly given an overview of the asset values represented by the monitored installations.

If a technical installation is replaced at a specific point in time, the costs arising from the business point of view are to be considered in the context of investment expenditure (also known as "capital expenditure" or CAPER). In contrast to this, a maintenance or repair of an installation is to be considered in the context of the operative business (or the "operational expenditure" OPEX).

The method according to the invention accordingly provides recommended actions for the management of technical installations which advantageously permit a particularly accurate planning of costs on the basis of measurements.

In a further preferred form of embodiment of the method according to the invention, in addition to the at least one measured value, static values for components of the installation and/or values recorded manually on a regular basis are taken into account in the determination of the operating condition. This is advantageous because in this way, a user's empirical knowledge can also be entered.

In a further preferred form of embodiment of the method according to the invention, the at least one measured value comprises at least one of the following measured values: temperature, pressure, voltage, current, pressure of an insulating gas, number of fault signals in a given period of time, number of alarms in a given period of time, switching power (in $I^2t$), $SF_6$ gas humidity, $SF_6$ gas purity, switching time for opening a switch, switching time for closing a switch, switching coil current, proportion of gas in the oil of an oil-cooled transformer, "top-oil" temperature in an oil-cooled transformer.

Depending on the type of the electrical installation being monitored (e.g. a switchgear or transformer) numerous further other measured values can advantageously be monitored and evaluated.

In a further preferred form of embodiment of the method according to the invention, historic data of the at least one measured value from a data memory can be taken into account when specifying the next maintenance date. This is an advantage because through this the data basis, and thus the precision in the determination of the next maintenance date, are increased.

In a further preferred form of embodiment of the method according to the invention, the at least one recorded measured value is continuously added to the historic data in the data memory. This is advantageous, because in this way the data basis is continuously enlarged during operation of the method.

In a further preferred form of embodiment of the method according to the invention, a large number of installations are monitored, and in each case average values and/or histograms of the operating condition and/or of the failure probability and/or the failure risk of the large number of installations of and of the respective chronological course, are determined. This is an advantage, because in this way, with a plurality of monitored installations, an overview is created for the user in order to permit statements regarding the entire fleet of technical installations.

In a further preferred form of embodiment of the method according to the invention, average values and/or histograms are weighted in such a way that different types of technical installations are included with different strengths in the calculation of the average values and/or histograms. This is advantageous, because different types of installations can have different degrees of significance for the consideration of the entire fleet of technical installations. The weighting can here be done, for example, with reference to expected values of the energy that will probably not be supplied as a result of the failure of a technical installation. The more serious the effects of the energy loss are, the more heavily the installation will be weighted according to this model.

The invention furthermore relates to an arrangement for an automatic condition monitoring of an electrical installation, and has the object of making an arrangement available with which technical installations can be operated particularly efficiently.

The achievement of this object is described by the arrangement claims.

The same advantages correspondingly result as have been explained above for the method of the invention.

In addition a data-processing program for execution in a data-processing arrangement is an object of the present invention, wherein the data-processing program comprises parts of a source code for carrying out the method according to the invention when the program runs on the data-processing arrangement.

The invention further relates to a computer program product, and has the object of providing a computer program product with which a method for a particularly efficient operation of technical installations can be carried out on a computer apparatus.

The achievement of this object is described by the computer product claims. The same advantages correspondingly result as have been explained above for the method of the invention.

BRIEF DESCRIPTION OF THE SEVERAL VIEWS OF THE DRAWING

For the sake of a better explanation of the invention below
The FIGURE shows a schematic representation of an exemplary embodiment of the arrangement according to the invention.

DESCRIPTION OF THE INVENTION

The arrangement 1 according to the invention comprises a technical installation 2 whose condition is automatically monitored. The installation 2 is a gas-insulated switchgear with a rated voltage of 400 kV.

The installation 2 comprises a plurality of components 21, 22, 23.

The component 21 is an insulation system, and is monitored by two sensor devices 3, 4, where sensor device 3 monitors the shield gas density, and sensor device 4 monitors the gas humidity.

The component 22 is a drive mechanism, and is monitored by two sensor devices 5, 6, where sensor device 5 monitors the opening time of the contacts of the switchgear, and sensor device 6 monitors the closing time of the contacts of the switchgear.

The component 23 are the elements that are responsible for the breaking capacity of the switchgear. Two sensor devices 7, 8 are used, wherein sensor device 7 monitors the rated current, and sensor device 8 monitors the switching power (in $i^2*t$).

By means of the communication connections 41, the measured values recorded by the sensor devices 3-8 are transmitted to a data-processing arrangement 9. The communication connections 41 can here be radio connections, conventional wired connections, connections via the Internet, or connections that transfer the data over a power network.

In an alternative embodiment, the recorded measured values can also first be collected in an intermediate evaluation apparatus (not illustrated).

The data-processing arrangement 9 uses the measured values in each case specifically for the installation, in order to determine an operating condition of the installation.

For this purpose the measured values that have been recorded by the sensor devices 5-8 are allocated to the components that said sensor devices monitor. The components of the installation are in turn allocated to four partial operating conditions 10-13.

The component 23 is allocated to the partial operating condition 10, which comprises the components of the insulation system (IS), wherein the partial operating condition 10 is entered into the determination of the operating condition with 50.7%.

The component 22 is allocated to the partial operating condition 11, which comprises the components of the drive mechanism (DM), wherein the partial operating condition 11 is entered into the determination of the operating condition with 23.4%.

The component 21 is allocated to the partial operating condition 12, which comprises the components of the breaking capacity (BC), wherein the partial operating condition 12 is entered into the determination of the operating condition with 12.3%.

The partial operating condition 13 comprises other factors (OF), and is entered into the determination of the operating condition with 13.6%. The sensor device 39 measures a measured value that is not yet allocated to any of the main components 21, 22, 23 of the installation. In addition to this, further factors such as age of the components, maintenance compliance, inspection compliance, inspection results and maintenance results are included in the partial operating condition 13, where these are obtained from a data memory 43 by means of a data transmission connection 41. The data memory 43 can be manually filled by a user. Alternatively, the data memory 41 can be filled by obtaining data from a system for the planning and execution of maintenance, repairs and replacement of installations.

As the next steps according to the invention, the measured data obtained from the sensor devices 3-8, and the empirical data obtained from the data memory 43, are used in order to age the determined measured data using component-specific aping functions. Both the current and the future operating conditions can be determined in this way. Examples for the use of aping functions are illustrated in steps 14 to 17.

The calculation of an exponentially increasing aping function is performed, for example, for the measured value of the closing time, which is monitored by sensor device 6, as follows: according to the manufacturer, the service life of the component is 50 years (parameter L); also according to the manufacturer's data, the minimum closing time is 34 ms ($OT_t$), and the maximum (permissible) closing time is 38 ms ($OT_{t+L}$). The environmental condition factor for the aping process is deemed to be negligible when the installation is in climate-controlled rooms (parameter B=1); for installations that are not in climate-controlled conditions, a parameter B>1 is selected, in order to take the increased aping resulting, for example, from increased air humidity or temperature, into account. According to the equation $$OT_{t+L}=OT_t*(1+B*C)^T$$

a value of about 0.002 results for the exponential factor C. According to the above equation, the future chronological course of the closing time as from the current date can be calculated. In a comparable manner, exponentially falling, linearly increasing and constant aping functions can be determined on the basis of known manufacturer's data.

For example, the following measured values for a 400 kV GIS switchgear can be aged in accordance with an exponentially falling aping function: gas purity, gas dew point.

For example, the following measured values for a 400 kV GIS switchgear can be aged in accordance with an exponentially increasing aping function: closing time, opening time, current of an open coil, current of a closed coil, compression motor current for a spring, switching capacity.

For example, the following measured values for a 400 kV GIS switchgear can be aged in accordance with a linearly rising aping function: number of breaking faults, part discharge, running time of the motor for a spring drive, number of operations of the installation, number of faults when closing, load current, aping parameter of the installation.

For example, the following measured values for a 400 kV GIS switchgear are aged or held constant by means of a constant aping function: inspection compliance, maintenance compliance, maintenance results.

Step 14 shows an application of an exponentially falling aping function to a measured value $P_1$ for a component, so that the current measured value 15 deteriorates exponentially, starting from the present point in time $t_1$ and measured value $P_2$. The gas dew point, for example, deteriorates exponentially.

In a similar manner, step 15 shows the effect of a linear aping function on a measured value $P_3$, starting from the current measured value 18 at the measuring point $t_1$, $P_4$; step 16 shows the effect of an exponentially increasing aping function on a measured value $P_5$ starting from the current measured value 19 at measuring point $t_1$, $P_6$.

Step 17 shows the effect of a constant aping function (the operating condition remains the same over time) on a measured value $P_7$, starting from the current measured value 20 at measurement point $T_1$, $P_8$.

In a similar way, all the recorded measured values are aged starting from the day they are recorded, in order to obtain a course of an operating condition for the respective partial operating condition 10-13 (not shown).

The partial operating conditions are, as indicated above, brought together in a weighted manner, and yield a chronological course of the operating condition of the entire installation 2, as is illustrated in step 24.

The operating condition H deteriorates from the commissioning $t_0$ of the installation, from a value of zero up to a value of 10 at the end of operation of the installation $t_E$. At the current point in time $t_1$, an operating condition $H_1$ results with a value of 4.5, which is indicated by the point 25 on the operating condition curve.

There is, furthermore, a dependency of an expected maintenance interval M (measured in years, a) on the operating condition, as is illustrated schematically in the FIG. 45. As the operating condition of an installation becomes poorer, the maintenance interval is set shorter. In the example illustrated, an installation that is in mint condition with an operating condition value of 0 has a maintenance interval of 2 years; starting from an operating condition of 4, this becomes shorter, until, at an operating condition of 7, a maintenance interval of 1 year is reached. At the current operating condition of 4.5, step 24 thus yields a current maintenance interval of $M_x$, which is about 1.83 years.

It must, however, be borne in mind that it is not simply possible to set a maintenance date that is 1.83 years following the previous maintenance. This would fail to consider the fact that in the time from now until the maintenance date, the operating condition would continue to deteriorate as a result of the aping of the installation, and the maintenance interval would accordingly also have to be shortened. Without a corrective calculation, the maintenance date would thus regularly be set too far into the future, and there would be a risk of a failure or fault in the installation.

For this reason, a comparison is made in step 26 between the course of the maintenance interval 27 adjusted to the respective operating condition, which continuously falls, and a linear time line 28 which represents the months following the current date. The next maintenance date $t_M$, indicated by point 29, is specified for the place where the two curves meet.

The specified maintenance date $t_M$, the current operating condition H1 and the future chronological course of the operating condition are transmitted by means of a further communication connection 41 to a display apparatus, where they are presented for reading by a user.

In a development of the system, it is also possible to transmit the specified maintenance date $t_M$ to a system for planning maintenance work. Taking employee work plans, geographical information on routes and installation sites, as well as, if relevant, weather forecasts into account, this system can then plan a suitable trip for maintaining, repairing or replacing these and other installations with specified maintenance dates that are chronologically close to each other, and make it available for a user.

The invention claimed is:

1. A method for an automatic condition monitoring of a technical installation, the method comprising:
    recording, with at least one sensor device at the installation, at least one measured value of at least one component of the installation and using the at least one measured value in a data-processing arrangement, in each case specifically for the installation, for determining a current operating condition of the installation;
    determining, with a data processing arrangement, the current operating condition of the technical installation from a plurality of partial operating conditions, wherein individual components of the installation are each allocated to the individual partial operating conditions, and wherein the data processing arrangement brings together each of the individual partial operating conditions in a weighted manner to determine the current operating condition;
    determining, with the data processing arrangement, a future chronological course of the operating condition, making use of component-specific ageing functions, on a basis of the current operating condition;
    adjusting, with the data processing arrangement, a maintenance interval for the installation on a basis of the future chronological course of the operating condition, in order to specify a next maintenance date of the installation;
    wherein the installation is a transformer, a gas-insulated switchgear, or an air-insulated switchgear.

2. The method according to claim 1, which comprises continuously updating a specification of the next maintenance date based on the at least one recorded measured value.

3. The method according to claim 1, wherein the adjusting step comprises:
    adjusting a prespecified maintenance interval respectively for a subsequent point in time with a specified time interval from a current date, taking into account the operating condition at a subsequent point in time known from the future chronological course of the operating condition, wherein the maintenance interval determined until the subsequent point in time is a predetermined maintenance interval for a next subsequent point in time, until the maintenance interval has become so short that it coincides with a subsequent point in time or comes to lie before the subsequent point in time.

4. The method according to claim 1, which comprises determining a weighting of an individual partial operating condition on a basis of a known total fault rate for the type of the installation, by determining a relative proportion that the allocated components have in a total fault rate for the allocated components.

5. The method according to claim 4, which comprises:
    allocating each recorded measured value of a component to an individual partial operating condition;
    including each measured value in a determination of the allocated individual partial operating condition with a relative proportion in the allocated partial operating condition, by determining, for the allocated component, a relative proportion that the allocated component has in the fault rate of all the components of the individual partial operating condition.

6. The method according to claim 1, which comprises establishing which partial operating conditions correlate, and forming a quotient for each two correlating partial operating conditions, and, when the quotient falls below a lower threshold value or exceeds an upper threshold value, issuing a warning message, so that a maintenance date can be brought forward.

7. The method according to claim 1, which comprises determining a chronological course of a failure probability of the installation on a basis of the chronological course of the operating condition, and thereby taking into account a known chronological course of the failure probability of a type of the installation.

8. The method according to claim 7, which comprises determining a chronological course of a risk of failure from the chronological course of the failure probability of the installation, taking into account the consequences of a failure of the installation.

9. The method according to claim 8, wherein the consequences of the failure of the installation include costs of the failure that depend on a type of the installation and a location of the installation.

10. The method according to claim 9, which further comprises taking into account an installation performance and/or an availability of spare parts in a calculation of the failure risk.

11. The method according to claim 8, which further comprises taking into account an installation performance and/or an availability of spare parts in a calculation of the failure risk.

12. The method according to claim 1, which comprises determining a point in time for an exchange or repair of the installation by calculating a chronological course of the discounted new price of the installation and determining a minimum of the chronological course of a total of a failure risk and a discounted new price.

13. The method according to claim 1, which comprises monitoring a multiplicity of installations and in each case determining average values and/or histograms of the operating condition and/or of the failure probability and/or of the failure risk of the multiplicity of installations and of the respective chronological course.

14. A computer program product, comprising: a non-transitory computer-readable medium storing a computer-readable program code configured to cause a computer, forming a data-processing arrangement, and/or a cloud-based data processing arrangement to carry out the method according to claim 1 when the computer program product is executed on the computer and/or on the cloud-based data-processing arrangement.

15. The method according to claim 1, which comprises: performing maintenance on the installation based on the next maintenance date specified by the future chronological course of the operating condition.

16. An arrangement for an automatic condition monitoring of an electrical installation, the arrangement comprising:

at least one sensor device disposed at the electrical installation and configured to acquire at least one measured value of at least one component of the installation; and a data processing arrangement connected to receive from said at least one sensor device the at least one measured value and configured to use, in each case specifically for the installation, the at least one measured value for determining a current operating condition of the installation;

said data processing arrangement being configured to determine the current operating condition of the technical installation from a plurality of partial operating conditions, wherein individual components of the installation are each allocated to the individual partial operating conditions, and said data processing arrangement is configured to bring together each of the individual partial operating conditions in a weighted manner to determine the current operating condition;

said data processing arrangement being configured to determine a future chronological course of the operating condition making use of component-specific ageing functions on a basis of the current operating condition, and to adjust a maintenance interval for the installation on a basis of the future chronological course of the operating condition, in order to specify a next maintenance date of the installation;

wherein the installation is a transformer, a gas-insulated switchgear, or an air-insulated switchgear.

* * * * *